United States Patent [19]

Giuroiu

[11] Patent Number: 5,684,483

[45] Date of Patent: Nov. 4, 1997

[54] FLOATING POINT DIGITAL TO ANALOG CONVERTER

[75] Inventor: Horia Giuroiu, Singapore, Singapore

[73] Assignee: Tritech Microelectronics, Singapore, Singapore

[21] Appl. No.: 665,330

[22] Filed: Jun. 17, 1996

[51] Int. Cl.[6] .................................................. H03M 1/78
[52] U.S. Cl. ................................................ 341/154; 341/144
[58] Field of Search .................................. 341/139, 138, 341/141, 144, 131, 154

[56] References Cited

U.S. PATENT DOCUMENTS

| | | | |
|---|---|---|---|
| 4,177,457 | 12/1979 | Howlett | 340/347 |
| 4,393,369 | 7/1983 | Daries | 340/347 |
| 4,539,883 | 9/1985 | Chihana | 84/1.22 |
| 4,727,355 | 2/1988 | Kohdaka et al. | 340/347 |
| 4,951,054 | 8/1990 | Kohdaka | 341/138 |
| 5,021,785 | 6/1991 | Kohdaka et al. | 341/138 |

Primary Examiner—Jeffrey A. Gaffin
Assistant Examiner—Peguy JeanPierre
Attorney, Agent, or Firm—George O. Saile; Stephen B. Ackerman

[57] ABSTRACT

A digital to analog converter (DAC) is shown which converts a floating point digital signal into an analog output. This is accomplishing by using one R-2R ladder network having more nodes than there are current generators to be connected to the nodes. The current generators representing the mantissa part of the digital signal are connected to the nodes of the single ladder network in a contiguous block arrangement and in order from the LSB to the MSB of the mantissa. The position of the block of current generators is controlled by the exponent part resulting in the proper scaling of the mantissa value in the output analog signal. Thus using fewer parts that must be accurately matched to provide a consistent accuracy and resolution over a wide range of input signal.

13 Claims, 2 Drawing Sheets

FLOATING POINT DIGITAL TO ANALOG CONVERTER

BACKGROUND OF THE INVENTION

1. Field of the Invention

This invention relates to a digital to analog, converter, known herein as a DAC, and having the capability to convert a floating point digital input signal to an analog output. The conversion of a floating point signal as compared to a straight binary digital input signal produces an output with more consistent accuracy and resolution over a wider range of inputs, known to the musical instrument field as improved distortion.

2. Description of Related Art

A floating point signal with its mantissa and exponent parts lends itself to providing a consistent accuracy and resolution in a digital to analog converter over a wide range of inputs. The mantissa part provides the unscaled amplitude and the exponent part provides the scaling factor. By using the term consistent is meant that a change in the least significant bit (LSB) of the mantissa part will produce the same relative change in the output signal scaled by the value of the exponent part. If the mantissa has 12 bits, then a change of the LSB in the mantissa would be 1 part in 4096 regardless of the exponent. However, in a straight binary converter the effect of the LSB depends on the magnitude of the binary word. For example, a full 12 bit binary word would have the same sensitivity to the change of the LSB as the mantissa part above, but with a 10 bit binary word, most significant bits (MSB) are zero, a change in the LSB would be 1 part in 1024. This produces much lower resolution and potentially lower accuracy than with a floating point digital to analog converter.

The need to produce a floating point digital to analog conversion is driven in part by the musical instrument field where there is a need to maintain a distortion free output over a very wide dynamic range. The conversion of floating point digital signals to analog has been done by extracting from the floating point signal both the mantissa and exponent and creating a mantissa part and an exponent part. As in U.S. Pat. No. 4,727,355 (Kohdaka, et al.), these separate parts being processed separately and then combined to produce the output analog signal. In some approaches this entails the use of two R-2R ladder networks to convert the signals. Referring to U.S. Pat. No. 5,021,785 (Kohdaka, et al.), a typical floating point to analog conversion process using two ladder networks would first separate the input signal into a mantissa part and an exponent part. Then the mantissa part would be processed through a R-2R ladder network to produce an analog signal proportional to the mantissa part of the input signal. The analog signal of the mantissa part then would be applied at one end of the second R-2R ladder network. The exponent part of the signal is then used to select one of the nodes of the second ladder network. In doing such the mantissa part of the signal is scaled, and producing an analog signal that is proportional to the floating point input signal. This produces a consistent accuracy and resolution in the output analog signal because the mantissa is first converted to an analog signal and then scaled, but there are two resistor ladder networks in which the resistors must be matched to produce this accuracy and resolution. Some schemes have means for excluding the least significant bits in a low magnitude signal. Still other schemes, as in U.S. Pat. No. 4,393,369 (Davies), use multiplying digital to analog converters connected in parallel and in series, and being fed by the mantissa and exponent parts to provide an output current proportional to the input floating point digital signal. Consistent throughout these schemes is the separating of the mantissa and exponent parts to be further processed into the resulting analog signal.

SUMMARY OF THE INVENTION

In this invention a set of equal amplitude current generators are connected to the nodes of a single R-2R ladder network through a set of switches arranged in a matrix of columns and rows. The nodes of the R-2R ladder network being the junctions between each set of shunt and series resistors of the ladder network. There are "n" current generators to be connected to "m" nodes in the ladder network, where m>n. The input floating point digital signal is used to control which switch is connected to which node. The input digital signal is of the form, $N=Mn \times 2^{-K}$ where Mn is the value of the nth bit of the mantissa and K is the value of the exponent, or scaling factor. The switches are controlled such that n current generators are connected to a contiguous set of nodes in the ladder network, offset from the most significant node (MSN) of the ladder network by the exponent value K. The most significant ladder network node being the one from which the output current flows through a series resistor to the ladder network output and then to the input of a current summing operational amplifier. This output current being proportional to the floating point digital input signal.

The exponent part of the floating point input signal is used to determine where along the series of nodes of the R-2R ladder network the contiguous block of current generators can be connected. If the value of the exponent is K=0, the block of current generators are connected to the ladder network nodes starting with the MSN and in turn each the next n-1 nodes. When K=0 no scaling takes place and the DAC functions similar to one that has a straight binary digital input. The switches are controlled such that only one current source can be connected to a node at one time and no more than one node can be connected to a current source Further, if the value of any bit in the mantissa is Mn=0, the corresponding switch is opened providing zero current into the corresponding node. Another method for accomplishing this setting of the value of the current generator to zero, or off, would be to control the individual current generators.

If the value of the exponent is K=1, the first current source is connected to the ladder network node that is adjacent to the MSN. No current generator is connected to the MSN and the output current is scaled by 2. If K=2, the first connection of the current generators is offset from the MSN by 2 nodes and the resulting output current is scaled by 4 versus a connection to the MSN where K=0.

This invention provides a simple method for converting a floating point signal into an analog current and requiring only one conversion circuit and will be further understood by viewing the drawings in concert with the description in the preferred embodiment.

DESCRIPTION OF THE PREFERRED EMBODIMENT

Figure 1:
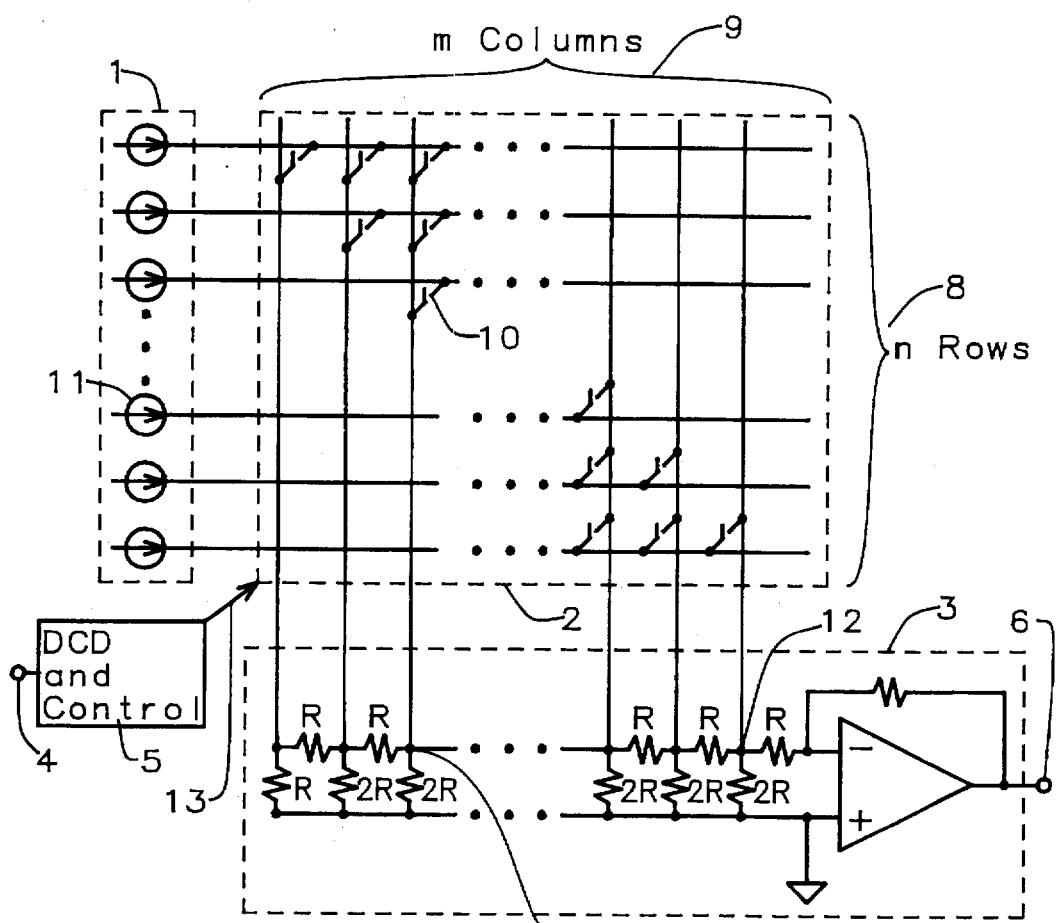
FIG. 1 is the circuit diagram of a floating point DAC in accordance with the present invention, and FIG. 2(a–c) is a circuit diagram demonstrating the connection of the current sources to a single ladder network of the DAC for various exponents.

Referring to FIG. 1, a floating point DAC is constructed from a set of current generators 1 connected to a set of switches 2. The set of switches 2 being further connected to a R-2R ladder network and operational amplifier 3. A floating point digital signal is connected to input 4 and further connected to a decoder and control block 5. The output 13 of block 5 is connected to and controls the set of switches 2. The set of switches 2 are arranged in rows 8 and columns 9. Each switch typified by 10 connects a different row 8 to a different column 9. There is one row 8 for every current generator typified by 11, and there is one column 9 for every node typified by 7 of the ladder network 3. There are more columns 9 than there are rows 8 in the switch set 2. The output 6 of the DAC is produced by the ladder network and operational amplifier 3.

The decoder and control circuitry is shown as block 5 in FIG. 1 and is connected 13 to the set of switches 2. The logic design of block 5 is such that can be easily understood and designed by those skilled in the art of logic design, the details of which are not shown herein. The decoder and control block 5 separates the mantissa part from the exponent part of the input floating point signal 4, decodes the exponent part and applies the proper control signals to the set of switches 2 through connection 13. The decoded exponent part is used to control to which of the nodes 7 of the ladder network 3 the current generators 11 can and cannot be connected. This is accomplished by controlling each of the switches 10 in each of the columns 9 to be disabled or allowed to be enabled depending on the value of the exponent. The mantissa part controls which current generator 11 will be connected to which column 9 by enabling that switch 10 connecting a row 8 to a column 9. Each current generator 11 and corresponding row of switches 8 being associated with a bit position of the mantissa. Further, each row 8 of switches is conditioned by the mantissa part to allow switches 10 to be enabled or to disabled in the entire row 8 depending on the value of the corresponding bit in the mantissa being a logical "1" or "0". An alternate method could be to control the current generators on or off depending on the corresponding bit in the mantissa being a logical "1" or "0". When enabled only one switch 10 in each row of switches 8 can be controlled to be connected to a column 9. In like manner only one switch 10 in each of the columns 9 can be controlled to be connected to a row 8 at one time. Thus as an example: if the switches in the particular column 9 are not disabled by the exponent part and if the switches in a particular row are not disabled by the value of a particular mantissa bit being a logical "0", then a switch 10 can connect one row 8 to one column 9 and thus connect a current generator 11 to a node 7.

Each bit of the decoded exponent is associated with a column 9 of switches starting with the column connected to node 12 and the adjacent nodes 7 until there are no more bits in the decoded exponent to be associated with an adjacent node. The least significant bit (LSB) of the decoded exponent part is associated with controlling the column 9 of switches 10 connected to node 12 which is the most significant node (MSN) of the ladder network 3. The next LSB of the exponent part controls the column 9 of switches 10 connected to the node typified by 7 which is adjacent to node 12. This continues with columns 9 connected to additional adjacent nodes 7 until the most significant bit (MSB) of the exponent pan has been associated with the furthest adjacent column 9 and node 7.

Each bit of the mantissa is associated with a current generator 11 and a row of switches 8. The MSB bit of the mantissa is associated with a row 8 and a current generator 11. If the value of the MSB of the mantissa is a logical "1", then the switch 10 in the row 8 is selected which is closest to the column 9 connected to the MSN 12 and which is not disabled by the exponent part. If the value of the MSB in the mantissa is a logical "0" the particular switch 10 will not be closed, thus applying zero current to the node 7. In like manner the next MSB of the mantissa and its associated current generator 11 and row 8 is connected to a column next closest to the MSN 12 of the ladder network 3. Again, if the value of the next MSB of the mantissa is a logical "0", then the particular switch in the row 8 will remain open allowing no current to be connected to the node 7. In like manner the rest of the bits of the mantissa in bit order are associated with a current source 11 and row 8 and connected to the appropriate column 9 until the LSB of the mantissa is associated with a current generator 11 and row 8, and connected to the furthest column from the MSN 12. In all cases if the value of the associated mantissa bit is a logical "0" the particular switch will not be closed and current of value 0 will be connected to the particular node.

Figure 2A:
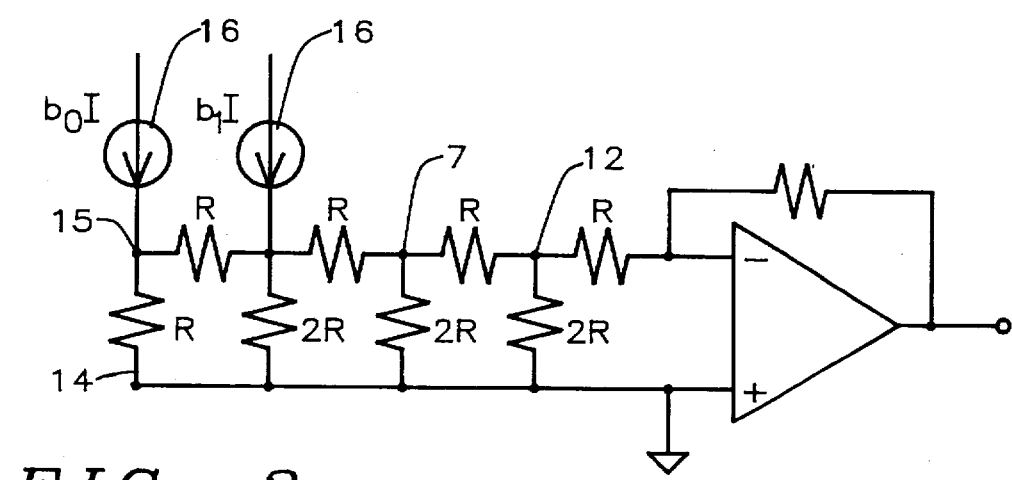
Figure 2B:
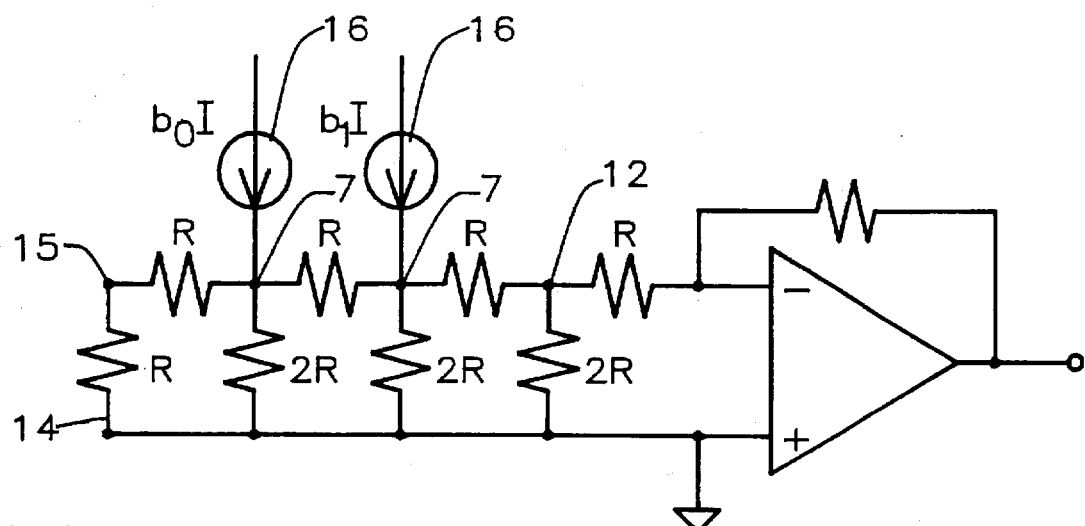
Figure 2C:
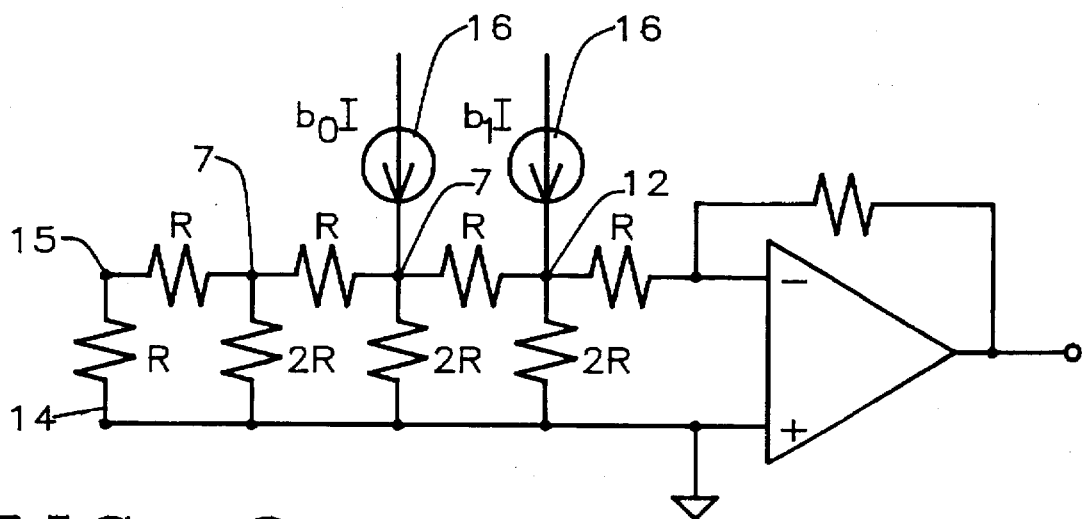

This is further illustrated in FIG. 2a, FIG. 2b and FIG. 2c. In these examples there is an equivalent circuit with a 4 node R-2R ladder network 14 having MSN 12 and other nodes 7. There is a two bit mantissa part is represented by the two current sources 16 and the value of the exponent varies, K=2, 1, and 0. The current associated with the MSB of the mantissa pan is $b_1 I$ and associated with the LSB of the two bit mantissa is $b_0 I$, where $b_1$ and $b_0$ are the values of the respective mantissa bits, "0" or "1". In FIG. 2a the exponent value is K=2. Thus no current generator can be connected to MSN 12 and also the node that is adjacent because the switches 10 in those corresponding columns 9 have been disabled by the value of the exponent. In FIG. 2b the value of the exponent is K=1, blocking only one column 9, that connected to MSN 12, from being used by the current sources. No current generator is connected to the last node 15 of the ladder network 14 since there is only a 2 bit mantissa. The situation in FIG. 2b could accommodate a 3 bit mantissa if the value of the exponent was no larger than one. In FIG. 2c, K=0 and connected to the MSN is a current source representing the MSB of the mantissa. The second current source is connected to the node adjacent to the MSN 12. This configuration is like that of a straight binary digital converter with the MSB of the digital input connected to the MSN.

While the invention has been particularly shown and described with reference to preferred embodiments thereof, it will be understood by those skilled in the art that various changes in form and details may be made without departing from the spirit and scope of the invention.

What is claimed is:

1. A floating point digital to analog converter, comprising:
    a) a digital decoder and controller having as its input a floating point signal, a set of current generators, a set of switches and a single R-2R ladder network connected to an operational amplifier,
    b) the input signal being constructed of a number of data bits which are divided between the mantissa part and exponent part of the floating point signal,
    c) the input signal being connected to said digital decoder and controller where the mantissa signal and exponent signal are extracted from the input signal,
    d) said digital decoder and controller being connected to and controlling the state of the switches,
    e) said switches connecting current generators to the nodes of the R-2R ladder network,
    f) said R-2R ladder network having more nodes than the number of current generators, g) the mantissa part controlling the set of switches as to how many current generators are to be connected to the R-2R ladder network, h) the exponent part controlling the set of switches as to where the current generators can be connected to the R-2R ladder network, i) the output of the R-2R ladder network connected to the current summing input of the operational amplifier, j) the output of said operational amplifier producing an analog voltage proportional to the floating point digital signal input.

2. The digital to analog converter of claim 1 wherein the current generators all produce currents of equal magnitude.

3. The R-2R ladder network of claim 1 wherein the number of nodes of the ladder network is at least as large as the sum of the mantissa part and the exponent part.

4. A floating point digital to analog converter, comprising:

a) a digital decoder and controller having as its input a floating point signal, a set of current generators, a set of switches and a single R-2R ladder network connected to an operational amplifier, b) the input signal being constructed of a number of data bits which are divided between the mantissa part and exponent part of the floating point signal, c) the input signal being connected to said digital decoder and controller where the mantissa signal and exponent signal are extracted from the input signal, d) said digital decoder and controller being connected to and controlling the state of the switches, e) said switches connecting current generators to the nodes of the R-2R ladder network, f) said R-2R ladder network having more nodes than the number of current generators, g) the mantissa part controlling the set of switches as to how many current generators are to be connected to the R-2R ladder network, h) the exponent part controlling the set of switches as to where the current generators can be connected to the R-2R ladder network, i) the output of the R-2R ladder network connected to the current summing input of the operational amplifier, i) the output of said operational amplifier producing an analog voltage proportional to the floating point digital signal input, k) a set of nodes closest to the output of the ladder network allocated to the exponent part, l) the closest node to said ladder network output being reserved for the highest value exponent, m) the current generator representing the most significant bit of the mantissa being connected to the node representing the value of the exponent, n) the current generator representing the least significant bit of the mantissa being connected to a node furthest away from the from the output of the ladder network than other current generator connections.

5. The digital to analog converter of claim 4 wherein the controller connects no more than one current generator to a node of the R-2R ladder network at a time.

6. The digital to analog converter of claim 4 wherein each bit in mantissa part determines whether a switch connecting a current generator to a node of the R-2R ladder network is open or closed, comprising:

a) said mantissa bit being a logical "1" said switch is closed, b) said mantissa bit being a logical "0" said switch remains open.

7. The digital to analog converter of claim 4 wherein the switches are controlled such that a number of current generators determined by the mantissa are connected to a contiguous set of nodes in the ladder network starting with the most significant bit closest to the output of the ladder network and ending with the least significant furthest from the output of the ladder network.

8. A digital to analog converter for converting a floating point signal into an analog signal, comprising:

a) set of current generators connected by a matrix of switches to a single R-2R ladder network, b) said matrix of switches arranged in columns and rows with more columns than rows, c) said current generators connected to the rows and nodes of said R-2R ladder network connected to the columns, d) said floating point signal consisting of a mantissa part and an exponent part, e) said mantissa part determining which current generator is connected by switch to the ladder network, f) said exponent part determining which nodes of said ladder network can be connected to current generators, g) connection of current generators to the columns of switches closest to the ladder network output determined by the exponent part, h) connection of current generators to columns furthest away from the ladder network output determined by the mantissa part, i) the output of the ladder network providing an analog signal equivalent to the floating point digital input signal.

9. The digital to analog converter of claim 8 wherein the matrix of switches exclusively connect rows to columns, comprising:

a) only one column can be connected to a row and only one row can be connected to a column, b) columns representing exponents larger than that of the digital input signal cannot be connected to rows.

10. The digital to analog converter of claim 8 wherein the mantissa part defines a contiguous block of connections of the current generators to the nodes of the ladder network, comprising:

a) said mantissa consisting of a series of bits ranging from the most significant bit (MSB) at one end to the least significant bit (LSB) at the other end of the series of bits, b) said MSB controlling the switch connecting a current generator to a column representing the value of the exponent part of the input digital signal, c) said least LSB controlling the switch connecting a current generator to a column furthest from the one associated with the MSB, d) each column of switches in the contiguous block is enabled to be "on" by the corresponding bit in the mantissa being a logical "1", e) each column of switches in the contiguous block is disabled to be "off" by the corresponding bit in the mantissa being a logical "0".

11. The contiguous block of connections of claim 10 wherein said block shifts toward and away from nodes close to the output of the ladder network depending the value of the exponent.

12. A floating point digital to analog converter using a set of current generators each producing the same current and a single R-2R ladder network to convert a floating point signal into an analog output signal, comprising:

a) the current generators being connected through a set of switches to the R-2R ladder network, b) the number of current generators being fewer than the number of R-2R ladder network nodes to which they can be connected, c) the exponent of the floating point signal being used to define to which R-2R ladder network nodes the current generators cannot be connected, d) the mantissa of the floating point signal being used to define the number of current generators to be connected to the R-2R ladder network, e) the output current of the R-2R ladder network being connected to a current summing operational amplifier to produce an output voltage proportional to the floating point input signal.

13. A floating point digital to analog converter using a set of current generators each producing the same current and a single R-2R ladder network to convert a floating point signal into an analog output signal, comprising:

a) the current generators being connected through a set of switches to the R-2R ladder network, b) the number of current generators being fewer than the number of R-2R ladder network nodes to which they can be connected, c) the exponent of the floating point signal being used to define to which R-2R ladder network nodes the current generators cannot be connected, d) the mantissa of the floating point signal being used to define the number of current generators to be connected to the R-2R ladder network, e) the output current of the R-2R ladder network being connected to a current summing operational amplifier to produce an output voltage proportional to the floating point input signal, f) a number of current generators selected by the mantissa of the floating point input signal and applied in a block to a contiguous set of nodes in the R-2R ladder network, g) said current generators being fewer in number than nodes in the R-2R ladder network, h) the position of the block within the nodes of the R-2R ladder network being determined by the exponent of the floating point input signal thus excluding some nodes from being connected to the current generators, i) said block as defined by the mantissa can vary in size affecting the resolution of the analog output, being limited in maximum size by the total number of nodes in the R-2R ladder network minus the nodes excluded by the exponent of the input floating point signal, j) the resolution of the analog output signal can be increased by decreasing the size of the possible exponent and thus the R-2R ladder network nodes allocated to the exponent.

* * * * *